United States Patent
Matsukura et al.

(10) Patent No.: US 11,987,503 B2
(45) Date of Patent: May 21, 2024

(54) POWDER FOR FILM FORMATION OR SINTERING

(71) Applicant: NIPPON YTTRIUM CO., LTD., Omuta (JP)

(72) Inventors: Kento Matsukura, Omuta (JP); Seiji Moriuchi, Omuta (JP)

(73) Assignee: NIPPON YTTRIUM CO., LTD. (JP)

( * ) Notice: Subject to any disclaimer, the term of this patent is extended or adjusted under 35 U.S.C. 154(b) by 0 days.

(21) Appl. No.: 17/603,022

(22) PCT Filed: Jul. 24, 2019

(86) PCT No.: PCT/JP2019/028954
§ 371 (c)(1),
(2) Date: Oct. 12, 2021

(87) PCT Pub. No.: WO2020/217552
PCT Pub. Date: Oct. 29, 2020

(65) Prior Publication Data
US 2022/0194809 A1    Jun. 23, 2022

(30) Foreign Application Priority Data
Apr. 26, 2019   (JP) ................................ 2019-085637

(51) Int. Cl.
*C01F 17/34*   (2020.01)
*C23C 4/11*    (2016.01)
(Continued)

(52) U.S. Cl.
CPC ................ *C01F 17/34* (2020.01); *C23C 4/11* (2016.01); *C23C 14/081* (2013.01);
(Continued)

(58) Field of Classification Search
None
See application file for complete search history.

(56) References Cited

U.S. PATENT DOCUMENTS

| | | |
|---|---|---|
| 2003/0059653 A1 | 3/2003 | Yamada et al. |
| 2003/0186034 A1 | 10/2003 | Yamada |

(Continued)

FOREIGN PATENT DOCUMENTS

| | | |
|---|---|---|
| JP | H03-218963 A | 9/1991 |
| JP | H10-236871 A | 9/1998 |

(Continued)

OTHER PUBLICATIONS

English translation of Kamiyanagi et al. (JP 2003-048713) (Year: 2003).*

(Continued)

*Primary Examiner* — Ronak C Patel
(74) *Attorney, Agent, or Firm* — Harness, Dickey & Pierce, P.L.C.

(57) ABSTRACT

A powder for coating or sintering has a peak assigned to cubic $Y_3Al_5O_{12}$ and a peak assigned to orthorhombic $YAlO_3$ exhibited in X-ray diffractometry, and the intensity ratio of the peak assigned to the (112) plane of the orthorhombic $YAlO_3$ to the peak assigned to the (420) plane of the cubic $Y_3Al_5O_{12}$ is at least 0.01 and less than 1. Alternatively, a powder for coating or sintering includes a composite oxide of yttrium and aluminum, and the volume of pores with a pore size of from 0.1 to 1 μm of the powder is at least 0.16 mL/g. It is preferable that, in X-ray diffractometry using CuKα radiation with a scan range of 2θ=20° to 60°, a peak assigned to the cubic $Y_3Al_5O_{12}$ is a peak that shows the highest peak intensity.

17 Claims, 1 Drawing Sheet

(51) Int. Cl.
*C23C 14/08* (2006.01)
*C23C 14/32* (2006.01)

(52) U.S. Cl.
CPC ............ *C23C 14/083* (2013.01); *C23C 14/32* (2013.01); *C01P 2002/60* (2013.01); *C01P 2002/72* (2013.01); *C01P 2002/76* (2013.01); *C01P 2004/61* (2013.01); *C01P 2006/12* (2013.01); *C01P 2006/14* (2013.01); *C01P 2006/16* (2013.01)

(56) References Cited

U.S. PATENT DOCUMENTS

| | | | | |
|---|---|---|---|---|
| 2005/0281302 A1* | 12/2005 | Lee | ............ | C04B 35/44 |
| | | | | 372/41 |
| 2006/0116274 A1 | 6/2006 | Kitamura et al. | | |
| 2006/0182969 A1 | 8/2006 | Kitamura et al. | | |
| 2008/0213496 A1 | 9/2008 | Sun et al. | | |
| 2015/0099075 A1 | 4/2015 | Hamaya et al. | | |
| 2017/0080407 A1* | 3/2017 | Schunk | .................. | C10G 2/50 |

FOREIGN PATENT DOCUMENTS

| | | |
|---|---|---|
| JP | 2001-158620 A | 6/2001 |
| JP | 2002-080954 A | 3/2002 |
| JP | 2002-302754 A | 10/2002 |
| JP | 2002-348653 A | 12/2002 |
| JP | 2003-048713 A | 2/2003 |
| JP | 2003-095649 A | 4/2003 |
| JP | 2003-277051 A | 10/2003 |
| JP | 2014-159637 A | 9/2014 |
| JP | 2016-138309 A | 8/2016 |
| JP | 2018-145528 A | 9/2018 |

OTHER PUBLICATIONS

International Search Report (English and Japanese) of the International Searching Authority issued in PCT/JP2019/028954, dated Sep. 17, 2019; ISA/JP (5 pages).

Hong Chen Zong, et al. "Seeding Effects on the Synthesis of Yag ($Y_3Al_5O_{12}$) Powders"; 2006 Annual Conference of Chinese Society of Particuology cum Symposium on Particle Technology across Taiwan Straits; dated Aug. 2006 (total 13 pages); and an abridged English translation.

Shi Ming Zhe, et al. "Seeding effects on the synthesis of YAG ($Y_3Al_5O_{12}$) Powders"; National Cheng Kung University Master's Thesis; dated Jun. 21, 2006 (total 81 pages); and an abridged English translation.

Kato "Evaluation of crystallite size using X-ray diffraction"; ACIST (Aichi Center for Industry and Science Technology) News; Jul. 2020 issue (total 2 pages).

Haruhiko Abe "Dry Etching"; Oyo Buturi, vol. 58, No. 10; 1984 (total 12 pages); and a partial translation of Table 1.

* cited by examiner

POWDER FOR FILM FORMATION OR SINTERING

CROSS REFERENCE TO RELATED APPLICATIONS

This application is a U.S. National Phase Application under 35 U.S.C. 371 of International Application No. PCT/JP2019/028954, filed on Jul. 24, 2019, which claims priority to Japanese Patent Application No. 2019-085637, filed on Apr. 26, 2019. The entire disclosures of the above applications are expressly incorporated by reference herein.

BACKGROUND

Technical Field

The present invention relates to a powder for coating or sintering.

Related Art

In the fabrication of semiconductor devices, a halogen-based gas, an argon gas, or an oxygen gas, for example, is used in an etching process. In order to prevent corrosion of an etching apparatus caused by these gases, generally, the inner side of the etching apparatus is thermally sprayed with a highly corrosion-resistant substance to be coated therewith. A material that contains an yttrium-aluminum composite oxide, such as yttrium aluminum garnet (YAG), is known as an example of such a highly corrosion-resistant substance.

For example, US 2006/0116274A1 discloses a thermal spraying powder including a composite oxide, wherein, when X-ray diffraction of the thermal spraying powder is measured, the ratio of the intensity of an X-ray diffraction peak of a (222) plane of yttria to the intensity of the maximum peak among an X-ray diffraction peak of a (420) plane of a garnet phase of the composite oxide, an X-ray diffraction peak of a (420) plane of a perovskite phase of the composite oxide, and an X-ray diffraction peak of a (−122) plane of a monoclinic phase of the composite oxide is 20% or less.

US 2006/0182969A1 discloses a thermal spraying powder including granulated and sintered particles of an yttrium-aluminum double oxide obtained by granulating and sintering a raw material powder containing yttrium and aluminum, wherein the total volume of pores having a diameter of 6 μm or less in the granulated and sintered particles is 0.06 to 0.25 $cm^3/g$.

However, coatings obtained by thermal spraying the powders disclosed in US 2006/0116274A1 and US 2006/0182969A1 have insufficient corrosion resistance against plasma etching. Therefore, an object of the present invention is to provide an yttrium-aluminum composite oxide powder that can eliminate the above-described various drawbacks of related art.

SUMMARY

The inventors of the present invention have conducted in-depth study on an yttrium-aluminum composite oxide powder in terms of a feature for effectively improving the corrosion resistance against plasma etching, and, as a result, have found that the corrosion resistance can be effectively improved by adopting a specific composition or pore volume.

The present invention was made based on the above-described findings, and provides a powder for coating or sintering, exhibiting a peak assigned to $Y_3Al_5O_{12}$ and a peak assigned to $YAlO_3$ in X-ray diffractometry, wherein an intensity ratio of a peak assigned to a (112) plane of orthorhombic $YAlO_3$ to a peak assigned to a (420) plane of cubic $Y_3Al_5O_{12}$ is at least 0.01 and less than 1.

Also, the present invention provides a powder for coating or sintering, the powder including a composite oxide of yttrium and aluminum, wherein the powder exhibits a peak within a pore size range from 0.1 to 1 μm in a pore volume distribution relative to pore sizes as measured using mercury intrusion porosimetry, and a volume of pores with a pore size of from 0.1 to 1 μm is at least 0.16 mL/g.

Also, the present invention provides a method for producing a coating, the method including forming a coating by using the above-described powder, and also provides a method for producing a sintered material, the method including sintering the above-described powder.

Also, the present invention provides a coating made from the above-described powder formed by thermal spraying or PVD, and also provides as a sintered material of the above-described powder.

DETAILED DESCRIPTION

Figure 1:
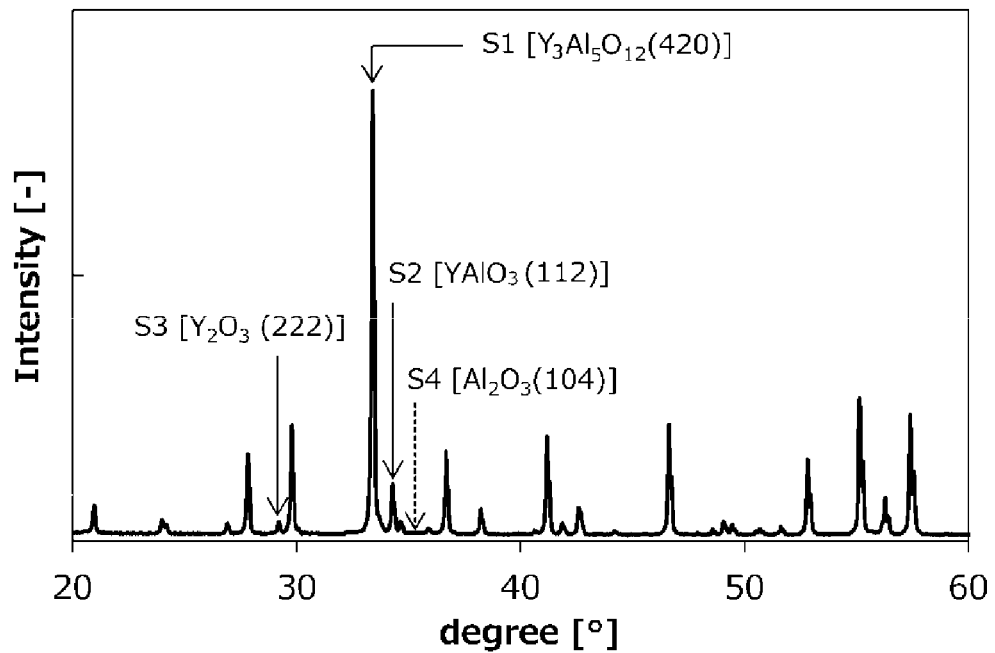
FIG. 1 is an X-ray diffraction pattern of a powder obtained in Example 1.

Hereinafter, the present invention will be described based on preferred embodiments thereof. A powder for coating or sintering of the present invention (hereinafter also referred to as the "powder of the present invention") is made of a composite oxide that contains yttrium and aluminum.

Composition of Powder for Coating or Sintering

When the powder of the present invention is subjected to X-ray diffractometry, a diffraction peak assigned to cubic $Y_3Al_5O_{12}$ (yttrium aluminum garnet) and a diffraction peak assigned to orthorhombic $YAlO_3$ are exhibited. The inventors of the present invention have found that a powder characterized by containing cubic $Y_3Al_5O_{12}$ and also orthorhombic $YAlO_3$ in an specific compositional ratio between them in X-ray diffractometry is likely to form a coating and a sintered material that are highly corrosion resistant against plasma etching. More specifically, the inventors of the present invention have found that it is advantageous in the powder of the present invention that the molar ratio of yttrium is slightly higher than the stoichiometric ratio of $Y_3Al_5O_{12}$, and that $YAlO_3$ is orthorhombic.

Specifically, it is preferable in X-ray diffractometry of the powder of the present invention that a peak assigned to cubic $Y_3Al_5O_{12}$ and a peak assigned to orthorhombic $YAlO_3$ be exhibited, and that the ratio of the intensity S2 of the peak assigned to the (112) plane of the orthorhombic $YAlO_3$ to the intensity S1 of the peak assigned to the (420) plane of the cubic $Y_3Al_5O_{12}$, S2/S1, be at least 0.01 and less than 1. The reason why a coating and a sintered material obtained from a powder that satisfies the above-described conditions have improved corrosion resistance is not clear; however, the inventors of the present invention consider that, if a powder has a molar ratio of yttrium slightly higher than the stoichiometric ratio of $Y_3Al_5O_{12}$ and includes orthorhombic $YAlO_3$, a coating or a sintered material having a composition that is stable against plasma etching is likely to be obtained. For example, with S2/S1 less than 1, the occurrence of the unstable melilite ($Y_4Al_2O_9$) composition can be effectively prevented. In view of improving the corrosion resistance of the coating or the sintered material even more, S2/S1 is more preferably from 0.02 to 0.5, and even more preferably from 0.03 to 0.3. $YAlO_3$ is a composite oxide, and is known to have cubic, orthorhombic, hexagonal, and other polytypes as its crystal structures. The inventors of the present invention consider that, if $YAlO_3$ has an orthorhombic crystal structure, of these crystal structures, a coating or a sintered material having a composition that is stable against plasma etching is likely to be obtained. This crystal structure is disclosed in 01-074-4236 of the ICDD's Powder Diffraction File database. Herein, a peak intensity ratio does not mean a ratio between the integrated intensities of two peaks, but means a ratio between the heights of two peaks (hereinafter, the same also applies to a "peak intensity" mutatis mutandis).

In X-ray diffractometry using CuKα radiation, a peak assigned to the (420) plane of cubic $Y_3Al_5O_{12}$ is exhibited at or near 2θ=33°, or specifically within a range of 2θ=33.3°±0.5°. In X-ray diffractometry using CuKα radiation, a peak assigned to the (112) plane of orthorhombic $YAlO_3$ is usually exhibited at or near 2θ=34°, or specifically within a range of 2θ=34.2°±0.5°. When the powder of the present invention is subjected to X-ray diffractometry using CuKα radiation in a scan range of 2θ=20° to 60°, a peak assigned to the cubic $Y_3Al_5O_{12}$ is preferably a peak that has the highest peak intensity, and more preferably, the peak assigned to the (420) plane of the cubic $Y_3Al_5O_{12}$ is a peak that has the highest peak intensity.

As described above, the powder of the present invention contains a small amount of $YAlO_3$, which has a higher Y/Al ratio than yttrium aluminum garnet $Y_3Al_5O_{12}$, and therefore, a peak assigned to yttrium oxide may be exhibited in X-ray diffractometry. In the case where a peak assigned to yttrium oxide is exhibited in X-ray diffractometry, the ratio of the intensity S3 of the peak assigned to the (222) plane of cubic $Y_2O_3$ to the intensity S1 of the peak assigned to the (420) plane of the cubic $Y_3Al_5O_{12}$, S3/S1, is preferably at least 0.001 and less than 0.1. With the ratio S3/S1 in this range, the yttrium oxide serves as an aid for reaction sintering of the yttrium-aluminum composite oxide during the production of a sintered material, so that a denser sintered material is more likely to be obtained. Also, in view of improving the corrosion resistance of the coating and the sintered material as well, S3/S1 is preferably at least 0.001 and less than 0.1. From these viewpoints, S3/S1 is more preferably from 0.002 to 0.05, and even more preferably from 0.003 to 0.03. The peak assigned to the (222) plane of cubic $Y_2O_3$ is usually exhibited at 2θ=29°, or specifically 29.2°±0.5°, in X-ray diffractometry using CuKα radiation.

It is preferable that, when the powder of the present invention is subjected to X-ray diffractometry, a peak assigned to an alumina phase should not be exhibited, or should be very small if exhibited, in view of improving the corrosion resistance against plasma etching. From this viewpoint, the ratio of the intensity S4 of the peak assigned to the (104) plane of trigonal $Al_2O_3$ to the intensity S1 of the peak assigned to the (420) plane of the cubic $Y_3Al_5O_{12}$, S4/S1, is preferably less than 0.1, more preferably at most 0.01, and even more preferably at most 0.001, or most preferably, the peak assigned to the (104) plane of trigonal $Al_2O_3$ is not exhibited. The peak assigned to the (104) plane of trigonal $Al_2O_3$ is usually exhibited at 2θ=35°, or specifically 35.2°±0.5°, in X-ray diffractometry using CuKα radiation.

In view of improving the corrosion resistance even more, it is preferable that, when the powder of the present invention is subjected to X-ray diffractometry, substantially no peaks assigned to components other than $Y_3Al_5O_{12}$, $YAlO_3$, $Y_2O_3$, or $Al_2O_3$ be exhibited. Within a scan range of 2θ=20° to 60°, the height ratio of the intensity of a peak assigned to any component other than $Y_3Al_5O_{12}$, $YAlO_3$, $Y_2O_3$, or $Al_2O_3$ to the peak assigned to the (420) plane of the cubic $Y_3Al_5O_{12}$ is preferably at most 0.1, more preferably at most 0.05, even more preferably at most 0.03, yet even more preferably at most 0.01, and most preferably at most 0.001.

Crystallite Size

The powder of the present invention preferably has a crystallite size of at least 50 nm as determined from the full width at half maximum of the peak assigned to the (420) plane of the cubic $Y_3Al_5O_{12}$. With such a crystallite size, the crystallinity of the cubic $Y_3Al_5O_{12}$ in a coating or a sintered material to be obtained can be improved, and the corrosion resistance of the coating or the sintered material can thus be improved even more. From this viewpoint, the crystallite size is preferably at least 60 nm, more preferably at least 70 nm, and even more preferably at least 80 nm. The crystallite size is preferably at most 110 nm, and more preferably at most 100 nm, when consideration is given to the ease of production of the powder of the present invention and a reduction in the pore volume due to grain growth. The crystallite size is obtained using the Sherrer equation. Specifically, the crystallite size can be obtained using a method described in Examples, which will be described later.

In order to obtain the powder of the present invention having the above-described composition and crystallite size, the particle sizes of an yttrium source powder and an aluminum source powder, which are the starting materials, can be adjusted or the firing temperature of the starting material powder can be adjusted, in a preferred method for producing the powder of the present invention, which will be described later.

Pore Volume

The inventors of the present invention have found that, if the pore volume of the powder of the present invention is within a specific range, the surface roughness of a coating to be obtained and the denseness of a sintered material to be obtained can be controlled. In particular, the inventors of the present invention have found that adjusting the pore volume of the powder of the present invention within the specific range is particularly advantageous in the case where the powder of the present invention is formed into granules. The surface roughness of the coating and the denseness of the sintered material are correlated with the corrosion resistance against plasma etching. Accordingly, the corrosion resistance of the coating and the sintered material can be controlled by controlling the pore volume of the powder of the present invention. Specifically, in the powder of the present invention, the volume of pores with a pore size of from 0.1 to 1 μm is preferably at least 0.16 mL/g. The volume of pores with a pore size of from 0.1 to 1 μm is attributed to voids between primary particles of the powder of the present invention. When the volume of pores of a pore size within this range is at least 0.16 mL/g, a coating with reduced surface roughness can be obtained, or a dense sintered material can be obtained. The reason for this is not clear; however, the inventors of the present invention infer that one of the reasons is as follows: in the powder of the present invention having a pore volume within the above-described range, primary particles constituting granules are fine, and the powder has a certain pore volume, thereby efficiently transmitting heat to easily melt. By contrast, the thermal spraying powder disclosed in US 2006/0182969A1 has a volume of pores with a pore size of from 0.1 to 1 μm of 0.05 mL/g when determined from FIG. 1 of US 2006/0182969A1, which is less than 0.16 mL/g and thus is out of the range of the pore volume in the present invention.

In view of improving the corrosion resistance against plasma etching of a coating and a sintered material to be obtained, the volume of pores with a pore size of from 0.1 to 1 μm, V1, of the powder of the present invention is preferably at least 0.16 mL/g, more preferably at least 0.20 mL/g, and even more preferably at least 0.24 mL/g. If the voids between primary particles are excessively wide, the granule strength decreases, and accordingly, the pore volume V1 of the powder of the present invention is preferably at most 1.0 mL/g, and more preferably at most 0.4 mL/g.

In view of improving the corrosion resistance, the volume of pores with a pore size of from 5 to 50 μm, V2, of the powder of the present invention is preferably at least 0.1 mL/g. The volume of pores with a pore size of from 5 to 50 μm is attributed to voids between secondary particles of the powder of the present invention. The pore volume V2 of the powder of the present invention is more preferably at least 0.15 mL/g, and even more preferably at least 0.20 mL/g. In view of sufficient fluidity, the pore volume V2 of the powder of the present invention is preferably at most 0.5 mL/g, and more preferably at most 0.4 mL/g.

In view of improving the corrosion resistance of a coating and a sintered material to be obtained from the powder of the present invention even more, the ratio of the pore volume V1 to the pore volume V2, V1/V2, as measured by mercury intrusion porosimetry is preferably at least 0.3, more preferably at least 0.4, and even more preferably at least 0.5. V1/V2 is preferably at most 1.0 in view of ensuring an appropriate granule density.

In the pore volume distribution relative to pore sizes as measured by mercury intrusion porosimetry (the particle size on the horizontal axis and the log differential intrusion volume on the vertical axis), the powder preferably exhibits at least one peak in a pore size range from 0.1 to 1 μm, in view of improving the corrosion resistance of a coating and a sintered material to be obtained from the powder of the present invention even more. More specifically, with regard to the peak(s) in the pore size range from 0.1 to 1 μm, it is more preferable that at least one peak be exhibited in a pore size range from 0.2 to 0.9 μm, and it is even more preferable that at least one peak be exhibited in a pore size range from 0.3 to 0.8 μm, in view of even more effectively improving the corrosion resistance. Hereinafter, a peak in the pore size range from 0.1 to 1 μm in the pore volume distribution may also be referred to as a pore first peak.

In the pore volume distribution relative to pore sizes as measured by mercury intrusion porosimetry (the particle size on the horizontal axis and the log differential intrusion volume on the vertical axis), the powder of the present invention preferably also exhibits at least one peak in the pore size range from 5 to 50 μm, in addition to the at least one peak in the pore size range from 0.1 to 1 μm, in view of improving the corrosion resistance even more. More specifically, with regard to the peak(s) in the pore size range from 5 to 50 μm, it is more preferable that at least one peak be exhibited in the pore size range from 7 to 35 μm, and it is even more preferable that at least one peak be exhibited in the pore size range from 8 to 25 μm, in view of improving the ease of production of the powder of the present invention and the corrosion resistance of the coating and the sintered material even more. Hereinafter, a peak in the pore size range from 5 to 50 μm in the pore volume distribution may also be referred to as a pore second peak.

In order to achieve the above-described pore volume of the powder of the present invention, the particle sizes of the yttrium source powder and the aluminum source powder, which are the starting materials, can be adjusted, or the firing temperature of the starting material powder can be adjusted, in a preferred method for producing the powder of the present invention, which will be described later.

Granule Size

In view of increasing even more the corrosion-resistance-improving effect of the above-described specific pore volume or the above-described specific composition, the powder of the present invention is preferably granular. The granules have an average particle size of preferably 15 to 100 μm, more preferably 20 to 80 μm, and even more preferably 25 to 60 μm, in view of ease of obtaining the powder of the present invention that satisfies the above-described pore volume distribution, and also in view of good fluidity of the powder when used as a thermal spraying material. The average particle size above is a particle size ($D_{50}$) at a cumulative volume of 50% from the smaller particle size side as measured by laser diffraction and scattering particle size distribution analysis, and can be measured using a method described in Examples, which will be described later.

BET Specific Surface Area

The powder of the present invention preferably has a BET specific surface area of 1 to 5 $m^2/g$. With such a BET specific surface area, the particles of the powder can moderately melt during the coating and the sintering, thereby easily forming a dense coating or sintered material, and also the powder has a moderate bulk density, which improves the ease of handling thereof. From these viewpoints, the powder of the present invention more preferably has a BET specific surface area of 1.5 to 4.5 $m^2/g$, and even more preferably 2.0 to 4.0 $m^2/g$. The BET specific surface area is measured using a BET single point method. Specifically, the BET specific surface area can be measured using a method described in Examples, which will be described later.

Next, a preferred method for producing the powder of the present invention will be described. Preferably, the present production method includes Steps 1 to 5 below. Either Step 1 or Step 2 may be performed first, or the two steps may be performed at the same time. Hereinafter, the individual steps will be described in detail.

Step 1: providing a slurry of aluminum source particles, the aluminum source particles having a $D_{50}$ of 0.05 to 2.0 μm.

Step 2: providing a slurry of yttrium source particles, the yttrium source particles having a $D_{50}$ of 0.1 to 2.0 μm.

Step 3: mixing the slurry of the aluminum source particles obtained in Step 1 and the slurry of the yttrium source particles obtained in Step 2.

Step 4: granulating the resulting slurry, i.e., the mixture obtained in Step 3, using a spray dryer to obtain a granulated product.

Step 5: firing the granulated product obtained in Step 4 at a temperature of 800° C. to 1700° C. to obtain granules of an yttrium-aluminum composite oxide.

Step 1

In this step, a slurry of aluminum source particles with a predetermined particle size is provided. With regard to the particle size of the aluminum source particles, the $D_{50}$ as measured using a laser diffraction and scattering particle size distribution analyzer is preferably from 0.05 to 2.0 μm, and more preferably from 0.1 to 1.0 μm, in view of successfully obtaining a powder having the above-described composition, pore volume, and specific surface area. The method for measuring $D_{50}$ of the aluminum source particles will be described in Examples later. Preferably, one or more compounds selected from aluminum oxide (alumina), aluminum oxyhydroxide, and aluminum hydroxide are used as the aluminum source.

With regard to the procedure of Step 1, the aluminum source particles are mixed with a liquid solvent, and the mixture is sufficiently stirred to obtain a slurry of the aluminum source particles. The aluminum source may be pulverized as necessary before or after being mixed with the liquid solvent. For the pulverization, the same pulverizing method as described later for the yttrium source particles can be used. There is no particular limitation on the type of the liquid solvent, and examples thereof include water and various organic solvents. With consideration given to the reactivity, it is preferable to use an aluminum source having a high specific surface area as the aluminum source. However, the viscosity of the slurry increases with an increase in the specific surface area of the aluminum source, and thus, any of dispersants and binders may be added to the slurry when mixing the aluminum source particles with the liquid solvent. Examples of the dispersants include a polyacrylic acid-based polymer, a carboxylic acid-based copolymer, acetic acid, and ammonia. In the case where a dispersant is added to the slurry of the aluminum source particles, the amount of dispersant added is preferably from 0.001 to 1 parts by mass, and more preferably from 0.01 to 0.1 part by mass, with respect to 100 parts by mass of the aluminum source in terms of alumina, in view of, for example, improving the quality of the powder to be obtained and suppressing an increase in the viscosity.

Step 2

In this step, a slurry of yttrium source particles with $D_{50}$ of 0.1 to 2.0 μm is provided. Preferably, one or more compounds selected from yttrium oxide, yttrium hydroxide, yttrium oxalate, and yttrium carbonate are used as the yttrium source. Commercially available products of these compounds usually have larger particle sizes than the above-described $D_{50}$, and in that case, the yttrium source is pulverized.

Either dry pulverization or wet pulverization can be used for the pulverization. The pulverization may be performed either in a single stage or in two or more stages. In terms of the cost and the time and labor, the pulverization is preferably performed in a single stage. It is preferable that a liquid solvent such as water be added after the pulverization to obtain a slurry. In the case where dry pulverization is performed, any of dry pulverizers, such as a mortar machine, a jet mill, a ball mill, a hammer mill, and a pin mill, can be used. In the case where wet pulverization is performed, any of wet pulverizers, such as a ball mill and a bead mill, can be used.

The pulverization of the yttrium source particles in this step is preferably performed such that $D_{50}$ as measured using a laser diffraction and scattering particle size distribution analyzer becomes 0.1 to 2.0 μm. With the yttrium source particles pulverized to this extent, a powder having the target pore volume V1, pore volume V2, and specific surface area is more likely to be obtained. From these viewpoints, the $D_{50}$ is more preferably 0.2 to 1.5 μm. The method for measuring $D_{50}$ of the yttrium source particles will be described in Examples, which will be described later.

Step 3

In this step, the slurry of the aluminum source particles obtained in Step 1 and the slurry of the yttrium source particles obtained in Step 2 are mixed to obtain a mixed slurry including the yttrium source particles and the aluminum source particles. At this time, the concentration of the mixed slurry is adjusted by adding pure water. With regard to the mixing ratio between the yttrium source and the aluminum source, it is preferable that the amount of yttrium of the yttrium source is more than 0.6 mol and at most 0.8 mol, and more preferably more than 0.61 mol and at most 0.7 mol, per 1 mol of aluminum of the aluminum source.

With regard to the concentration of the slurry in this step, the total concentration of the yttrium source in terms of yttria and the aluminum source in terms of alumina is preferably 50 to 1500 g/L, and more preferably 100 to 1000 g/L. When the slurry has a concentration within this range, it is possible to prevent excessive energy consumption and also to form a slurry having an appropriate viscosity that enables stable spraying.

Step 4

In this step, the slurry obtained in Step 3 is granulated using a spray dryer to obtain a granulated product containing yttrium and aluminum. In the operation of the spray dryer, the rotational speed of the atomizer is preferably 5000 to 30000 $min^{-1}$. When the rotational speed is at least 5000 $min^{-1}$, the yttrium source particles and the aluminum source particles in the slurry can be sufficiently dispersed to thereby obtain a uniform granulated product. On the other hand, when the rotational speed is at most 30000 $min^{-1}$, granules having the above-described pore second peak is more likely to be obtained. From these viewpoints, the rotational speed of the atomizer is more preferably 6000 to 25000 $min^{-1}$.

In the operation of the spray dryer, the inlet temperature is preferably 150° C. to 300° C. When the inlet temperature is at least 150° C., the solid matter can be sufficiently dried to thereby easily obtain granules with little residual water. On the other hand, when the inlet temperature is at most 300° C., wasteful energy consumption can be prevented.

Step 5

In this step, the granulated product obtained in Step 4 is fired to obtain granules of an yttrium-aluminum composite oxide. The degree of the firing is a factor for controlling the composition, the peak(s) of the volume of pores with a pore size of from 0.1 to 1 μm, and the specific surface area of the target powder. More specifically, the firing temperature is preferably 800° C. to 1600° C. When the firing temperature is at least 800° C., the target composition ratio is more likely to be achieved. On the other hand, when the firing temperature is at most 1600° C., granules having the target first peak in a pore volume distribution relative to pore sizes and the target specific surface area are more likely to be obtained. From these viewpoints, the firing temperature is more preferably 900° C. to 1550° C., and even more preferably from 1000° C. to 1500° C.

Provided that the firing temperature is within the above-described range, the firing time is preferably from 1 to 48 hours, and more preferably from 3 to 24 hours. There is no particular limitation on the firing atmosphere. However, depending on the type thereof, the aluminum source may need to be oxidized through firing, and oxygen ($O_2$) may be needed for this purpose; accordingly, the firing is preferably performed in an oxygen-containing atmosphere, such as the air.

The powder of the present invention obtained as described above can be used in various coating methods such as thermal spraying, physical vapor deposition (PVD), chemical vapor deposition (CVD), aerosol deposition (AD), and cold spraying, and preferably used in, for example, plasma spraying, which is a type of thermal spraying. Plasma spraying may be atmospheric pressure plasma spraying or low pressure plasma spraying. Physical vapor deposition (PVD) may be, for example, ion plating or sputtering. Examples of a substrate to be coated include those made of various metals such as aluminum, various alloys such as aluminum alloys, various ceramics such as alumina, and quartz.

The powder of the present invention can also be favorably used as the material of a ceramic component. More specifically, when the powder for coating or sintering of the present invention is used as the material for producing a ceramic component using, for example, an ordinary sintering method, a pressing method, HP, CIP, HIP, or SPS, a ceramic component with excellent smoothness and etching resistance can be obtained. The sintering temperature is not particularly limited, but is preferably from 1200° C. to 1800° C., and more preferably from 1300° C. to 1700° C., for example. The firing atmosphere may be an oxidized atmosphere such as an air atmosphere, or may be an inert gas atmosphere. Such a ceramic component can be favorably used in, for example, an electronic material and a jig used in firing for producing an electronic material, a member of a semiconductor equipment, and an etching apparatus and a coating apparatus that use plasma. A sintered material that is formed by sintering the powder for coating or sintering of the present invention can also be favorably used as a target (material for coating) in PVD, such as ion plating and vacuum evaporation.

The powder of the present invention includes particles containing an yttrium-aluminum composite oxide and having a specific composition or a specific pore volume, and thus can form a thermal sprayed coating that has higher corrosion resistance against plasma etching, compared with a conventional thermal spraying material containing an yttrium-aluminum composite oxide. Also, the powder for coating or sintering of the present invention can form a highly corrosion-resistant coating as well even when a method, such as PVD, other than thermal spraying is used. In addition, when the powder is sintered, a highly corrosion-resistant sintered material can be obtained. Since a coating or a sintered material obtained from the powder for coating or sintering of the present invention is thus highly corrosion resistant, the coating or the sintered material is therefore useful for, for example, a constituent member of a semiconductor equipment that employs plasma etching and a coating for such a member.

With regard to the composition of a coating formed of the powder of the present invention, the coating has a ratio S2/S1 of preferably 0 to 0.3, more preferably 0 to 0.2, and a ratio S3/S1 of preferably 0 to 0.1, more preferably 0 to 0.05, in view of improving the corrosion resistance against plasma etching, but the composition of the coating is not limited thereto. With regard to the composition of a sintered material of the powder of the present invention, the sintered material has a ratio S2/S1 of preferably 0 to 0.3, more preferably 0 to 0.2, and a ratio S3/S1 of preferably 0 to 0.2, more preferably 0 to 0.15, but the composition of the sintered material is not limited thereto. Preferred upper limits of S4/S1 of the coating and the sintered material may be the same as that described for the powder of the present invention. When the coating or the sintered material is subjected to X-ray diffractometry with the X-ray source and the scan range described hereinbefore, a peak assigned to cubic $Y_3Al_5O_{12}$ is preferably a peak that has the highest peak intensity, and more preferably, the peak assigned to the (420) plane of the cubic $Y_3Al_5O_{12}$ is a peak that has the highest peak intensity. When the coating or the sintered material is subjected to X-ray diffractometry with the X-ray source and the scan range described hereinbefore, substantially no peaks assigned to components other than $Y_3Al_5O_{12}$, $YAlO_3$, $Y_2O_3$, or $Al_2O_3$ are exhibited preferably. Even if any of such peaks is exhibited, the peak height of that peak is preferably at most 5%, more preferably at most 3%, and even more preferably at most 1%, based on the peak height of the peak assigned to the (420) plane of the cubic $Y_3Al_5O_{12}$.

The coating obtained from the powder of the present invention and the sintered material of the powder of the present invention have a low etching rate in plasma etching. Specifically, the coating and the sintered material preferably have an etching rate of at most 3 nm/min, and more preferably at most 2 nm/min, as measured using a method described in Examples, which will be described later.

In the case where a coating is produced from the powder of the present invention as the material, the coating preferably has low surface roughness in view of improved corrosion resistance against plasma etching. The surface roughness of the coating can be measured using a method described in Examples, which will be described later. Such a coating can be obtained by forming a coating by using the powder for coating or sintering of the present invention.

The sintered material of the present invention preferably has an open porosity of at most 1%, and more preferably at most 0.5%, in view of improved corrosion resistance against plasma etching. The open porosity can be measured using the Archimedes' principle in accordance with JIS R1634. Specifically, the open porosity is measured using the following method. Such a sintered material can be obtained by sintering the powder for coating or sintering of the present invention.

Method for Measuring Open Porosity (OP)

A sintered material is submerged in distilled water and kept for one hour under reduced pressure created by a diaphragm vacuum pump, and then, the underwater weight W2 (g) thereof is measured. Excess water is removed with a damp cloth, and the saturated weight W3 (g) is measured. After that, the sintered material is placed in a dryer and sufficiently dried, and then, the dry weight W1 (g) is measured. The open porosity (OP) is calculated using the following formula:

$$OP=(W3-W1)/(W3-W2)\times100(\%)$$

EXAMPLES

Hereinafter, the present invention will be described in greater detail by means of examples. However, the scope of the present invention is not limited to the examples below. Table 1 shows the production conditions (the kind of the aluminum source, amounts of the aluminum source and the yttria source used, the rotational speed of the atomizer in Step 4, and firing temperature in Step 5) in Examples and Comparative Examples.

Example 1

Step 1

10 kg of α-alumina and pure water were mixed and stirred to obtain a 250 g/L aluminum source slurry. The aluminum oxide had a $D_{50}$ of 0.13 μm as measured using Microtrac HRA (dispersion treatment with ultrasonic at 300 W). Specifically, $D_{50}$ was measured in the following manner. First, 0.1 to 1 g of a sample was placed in a 100-mL glass beaker, and about 100 mL of a 0.2 mass % sodium hexametaphosphate aqueous solution was added thereto. The beaker containing the sample and 100 mL of the 0.2 mass % sodium hexametaphosphate aqueous solution was set on an ultrasonic homogenizer US-300T (output: 300 W) manufactured by Nihonseiki Kaisha Ltd., and subjected to dispersion treatment with ultrasonic for 5 minutes to obtain a slurry. This slurry was added dropwise into a chamber of a sample circulator of Microtrac HRA manufactured by Nikkiso Co., Ltd. until the instrument determined that the concentration was adequate. The 0.2 mass % sodium hexametaphosphate aqueous solution was used as a dispersion medium.

Step 2

14 kg of yttria and 20 L of pure water were placed in a bead mill and subjected to wet pulverization. The pulverization was performed such that the $D_{50}$ of yttria became 0.6 to 0.8 µm as measured using Microtrac HRA (dispersion treatment with ultrasonic at 300 W). After the pulverization, the concentration was adjusted by further adding pure water to obtain a 500 g/L yttrium source slurry. The $D_{50}$ was measured in the same manner as in Step 1.

Step 3

The slurry obtained in Step 1 and the slurry obtained in Step 2 were mixed. After the mixing, the concentration was adjusted by further adding pure water to obtain a mixed slurry having a total concentration of yttria and alumina of 200 g/L.

Step 4

The mixed slurry obtained in Step 3 was granulated and dried using a spray dryer (manufactured by Ohkawara Kakohki Co., Ltd.) to obtain a granulated product. The operating conditions of the spray dryer were as follows:

Feed rate of slurry: 75 mL/min
Rotational speed of atomizer: 12500 rpm
Inlet temperature: 250° C.

Step 5

The granulated product obtained in Step 4 was placed in a container made of alumina, and fired in an air atmosphere in an electric oven to obtain granules. The firing temperature was 1400° C., and the firing time was 6 hours. The resulting granules had a substantially spherical shape. In this manner, a target powder of a composite oxide was obtained.

Measurement and Coating Formation

The powder obtained in Example 1 was subjected to X-ray diffractometry using a method described below to obtain an X-ray diffraction pattern. FIG. 1 shows the result. Based on the obtained X-ray diffraction pattern, relative intensities were calculated for the peak assigned to the (420) plane of cubic $Y_3Al_5O_{12}$, the peak assigned to the (112) plane of orthorhombic $YAlO_3$, the peak assigned to the (222) plane of cubic $Y_2O_3$, and the peak assigned to the (104) plane of trigonal $Al_2O_3$. Also, the pore first peak, the pore second peak, the pore volume, the crystallite size, the BET specific surface area, and the granule size ($D_{50}$) were measured according to the methods described below. Table 2 below shows the results. In the X-ray diffraction pattern within the scan range of $2\theta=20°$ to $60°$ of the powder obtained in Example 1, no peaks assigned to components other than $Y_3Al_5O_{12}$, $YAlO_3$, $Y_2O_3$, or $Al_2O_3$ were exhibited. Furthermore, a coating was obtained from the powder obtained in Example 1 under the "Conditions for Thermal Spraying for Forming Coating" below.

X-ray Diffractometry

Figure 2:
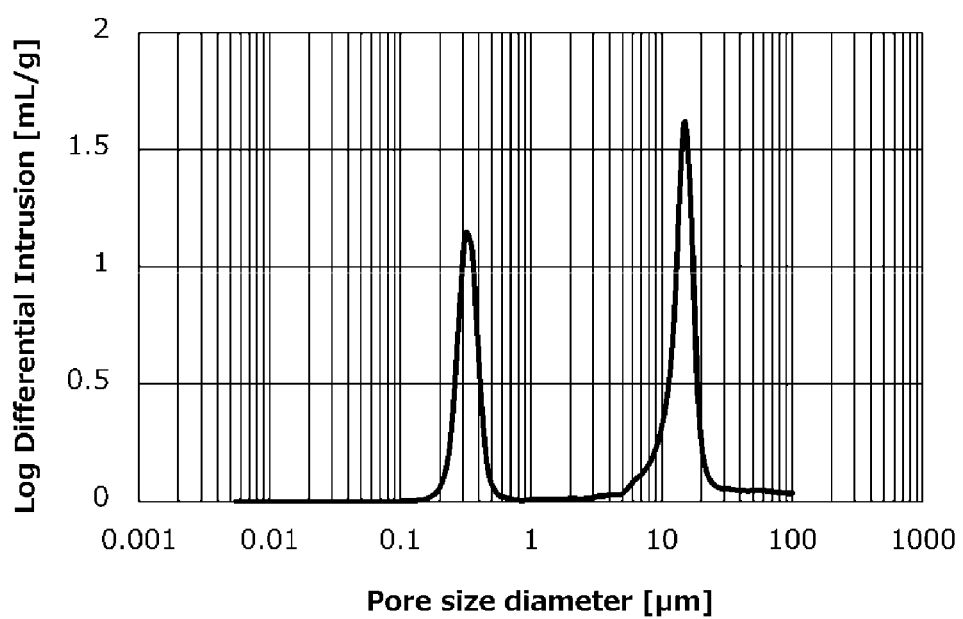
FIG. 2 is a chart of the pore size distribution of the powder obtained in Example 1.

Diffractometer: Ultima IV (manufactured by Rigaku Corporation)
X-ray source: CuKα radiation
Tube voltage: 40 kV
Tube current: 40 mA
Scan speed: 2 deg/min
Step: 0.02 deg
Scan range: $2\theta=20°$ to $60°$ Pore First Peak, Pore Second Peak, Volume of Pores with Pore Size of 0.1 to 1 µm, and Volume of Pores with Pore Size of 5 to 50 µm Porosimeter: AutoPore IV (manufactured by Micromeritics)
Pore first peak: When a pore size distribution of granules composed of primary particles is measured, two peaks are usually exhibited, and, of these peaks, the peak on the smaller diameter side is used as the first pore peak.
Pore second peak: Of the above-described peaks, the peak on the larger diameter side is used as the second peak.
Volume of pores with pore size of 0.1 to 1 µm: the integrated value of volumes of pores with a pore size from 0.1 to 1 µm
Volume of pores with pore size of 5 to 50 µm: the integrated value of volumes of pores with a pore size from 5 to 50 µm FIG. 2 shows the measurement results.

Measurement of Crystallite Size

To measure the crystallite size, the crystallite size was calculated using the Sherrer equation from the full width at half maximum of the peak assigned to the (420) plane of the cubic $Y_3Al_5O_{12}$ in the X-ray diffractometry described above.

Measurement of BET Specific Surface Area

The BET specific surface area was measured according to a BET single point method using a fully automatic BET specific surface area analyzer, Macsorb model-1201, manufactured by Mountech Co., Ltd. A nitrogen-helium mixed gas (nitrogen: 30 vol %) was used.

Measurement of Granule Size

The granule size was measured using Microtrac HRA manufactured by Nikkiso Co., Ltd. In the measurement, a 0.2 mass % sodium hexametaphosphate aqueous solution was used as a dispersion medium, and a sample (granules) was added into a chamber of a sample circulator of Microtrac HRA until the instrument determined that the concentration was adequate.

Conditions for Thermal Spraying for Forming Coating

A 20 mm square aluminum alloy plate was used as a substrate. Plasma spraying was performed on the surface of this substrate using the powder obtained in Example 1. TWIN-SYSTEM 10-V manufactured by Plasma-Technik AG was used as a feeder of the powder. F4 manufactured by Sulzer Metco AG was used as a plasma sprayer. The plasma spraying was performed to a coating thickness of about 60 µm, under the following conditions: stirring rotational speed, 50%; flow rate of carrier gas, 2.5 L/min; feed scale, 10%; plasma gas, Ar/H2; output, 35 kW; and space between apparatus and substrate, 150 mm.

The coating obtained was subjected to X-ray diffractometry using the above-described method. As a result, S2/S1 was 0.04, S3/S1 was 0.01, S4/S1 was 0, and, relatively to the peak assigned to the (420) plane of the cubic $Y_3Al_5O_{12}$, no peaks assigned to components other than $Y_3Al_5O_{12}$, $YAlO_3$, $Y_2O_3$, or $Al_2O_3$ were exhibited.

Example 2

A powder of a composite oxide was obtained in the same manner as in Example 1, except that the firing temperature in Step 5 was 1500° C. Then, evaluation and coating formation were performed in the same manner as in Example 1.

Examples 3 and 5

The amount of yttrium oxide in Step 2 of Example 1 was changed to 13.6 kg for Example 3, and 14.6 kg for Example 5. Evaluation and coating formation were performed in the same manner as in Example 1.

Example 4

A powder of a composite oxide was obtained in the same manner as in Example 3, except that the firing temperature in Step 5 was 1500° C. Then, evaluation and coating formation were performed in the same manner as in Example 1.

Example 6

A powder of a composite oxide was obtained in the same manner as in Example 5, except that the firing temperature in Step 5 was 1500° C. Then, evaluation and coating formation were performed in the same manner as in Example 1.

Example 7

A powder of a composite oxide was obtained in the same manner as in Example 1, except that the rotational speed of the atomizer in Step 3 was 20000 rpm. Then, evaluation and coating formation were performed in the same manner as in Example 1.

Example 8

A powder of a composite oxide was obtained in the same manner as in Example 1, except that the rotational speed of the atomizer in Step 3 was set to 25000 rpm. Then, evaluation and coating formation were performed in the same manner as in Example 1.

Example 9

A powder of a composite oxide was obtained in the same manner as in Example 1, except the following: the aluminum source in Step 1 was changed to aluminum oxyhydroxide; the amount of aluminum oxyhydroxide used was 10 kg in terms of aluminum oxide; and the firing temperature in Step 5 was 1300° C. Then, evaluation and coating formation were performed in the same manner as in Example 1.

Example 10

A powder was obtained in the same manner as in Example 9, except that the firing temperature in Step 5 was 1200° C. Then, evaluation and coating formation were performed in the same manner as in Example 1.

Example 11

A powder of a composite oxide was obtained in the same manner as in Example 1, except the following: the aluminum source in Step 1 was changed to aluminum hydroxide; and the amount of aluminum hydroxide used was 10 kg in terms of aluminum oxide. Then, evaluation and coating formation were performed in the same manner as in Example 1.

Example 12

A powder of a composite oxide was obtained in the same manner as in Example 11, except that the firing temperature in Step 5 of Example 10 was 1300° C. Then, evaluation and coating formation were performed in the same manner as in Example 1.

Comparative Example 1

A solution obtained by mixing 2.78 kg of yttrium nitrate and 3.59 kg of aluminum nitrate was neutralized with ammonia. The resulting precipitate was washed and collected by filtering, and the filter cake was dried at 120° C. and then disintegrated. The resultant was fired at 1200° C. After that, 2 kg of the obtained fired product was pulverized in a dry ball mill, and the resultant was then placed in a bead mill together with 2 L of pure water and subjected to wet pulverization. The pulverization was performed such that the $D_{50}$ of the fired product became 1.5 to 2.5 μm as measured using Microtrac HRA. After the pulverization, the concentration was adjusted by further adding pure water to obtain a slurry having a concentration of 550 g/L. Step 4 was performed using this slurry, and then the Step 5 was performed at a firing temperature of 1650° C., to thereby obtain a powder of a composite oxide. Then, evaluation and coating formation were performed in the same manner as in Example 1.

Comparative Example 2

A powder of a composite oxide was obtained in the same manner as in Example 1, except that Steps 2 and 3 were not performed, and that the firing temperature was 1400° C. Then, evaluation and coating formation were performed in the same manner as in Example 1. However, in the measurement of the crystallite size, the crystallite size was calculated from the peak assigned to the (104) plane of trigonal $Al_2O_3$, instead of the peak assigned to the (420) plane of cubic $Y_3Al_5O_{12}$, in this comparative example.

Comparative Example 3

A powder of a composite oxide was obtained in the same manner as in Example 1, except that Steps 1 and 3 were not performed, and that the firing temperature was 1400° C. Then, evaluation and coating formation were performed in the same manner as in Example 1. However, in the measurement of the crystallite size, the crystallite size was calculated from the peak assigned to the (222) plane of cubic $Y_2O_3$, instead of the peak assigned to the (420) plane of cubic $Y_3Al_5O_{12}$, in this comparative example.

Example 13

A coating was obtained by forming a coating by PVD under the following conditions using the powder of the composite oxide obtained in Example 1.
Coating Formation by PVD A 20 mm square aluminum alloy plate was used as a substrate. A coating was formed on this substrate using a high-frequency excited ion plating method, which is a type of PVD. The coating was formed to a coating thickness of 5 to 20 μm under the following conditions: argon gas pressure, 0.02 Pa; EB output, 0.6 kW; RF output, 1 kW; acceleration voltage, 1.5 kV; and space between substrate and evaporation source, 300 mm.

Example 14

The powder obtained in Example 1 was molded under a pressure of 20 MPa. The thus obtained molded body was fired at 1650° C. for 2 hours in an air atmosphere, and then allowed to cool naturally to 50° C. in an electric oven. The open porosity of the thus obtained sintered material was measured using the Archimedes' principle. As a result, the open porosity was 0.4%, and it was thus confirmed that the sintered material was sufficiently densified. The etching rate was 0.1 nm/min as measured using the method, which will be described later.

The sintered material obtained in Example 14 was subjected to X-ray diffractometry using the above-described method. As a result, S2/S1 was 0.05, S3/S1 was 0.12, S4/S1 was 0, and, relatively to the peak assigned to the (420) plane of cubic $Y_3Al_5O_{12}$, no peaks assigned to components other than $Y_3Al_5O_{12}$, $YAlO_3$, $Y_2O_3$, or $Al_2O_3$ were exhibited.

Comparative Example 4

A sintered material was obtained in the same manner as in Example 14, except that the powder obtained in Comparative Example 1 was used. The open porosity was 2%. The etching rate was 0.3 nm/min as measured using the method, which will be described later.

For the coatings formed as described above, the surface roughness and the etching rate were measured using the following methods. For the sintered materials as well, the etching rate was measured using the same method.

The surface roughness of the coating formed on the 20 mm square aluminum alloy plate by the method in each example or comparative example was measured.

Measurement of Surface Roughness of Coating

The arithmetic mean roughness (Ra) and the maximum height roughness (Rz) (JIS B 0601:2001) were obtained using a stylus instrument for measuring surface roughness (JIS B 0651:2001). A stylus profiler P-7 manufactured by KLA-Tencor was used as the stylus instrument. The measurement was performed under the conditions of a sampling length of 5 mm and a measurement speed of 100 μm/s. An average of the found values at three points was obtained.

Measurement of Plasma Etching Rate

A heat-resistant pressure-sensitive adhesive tape was attached to half area of the coating formed on the 20 mm square aluminum alloy plate by the method in each example or comparative example. Then, the aluminum alloy plate was placed in a chamber of an etching apparatus (RIE-10 NR manufactured by Samco Inc.) with the coating facing upward. Plasma etching was performed, and the etching rate was measured. The conditions for the plasma etching was as described below. The etching rate was also measured for sintered materials, instead of the coatings. As the sintered material, that having a size of 16 mm diameter×2 mm was subjected to the measurement. The step height between the plasma-exposed surface and the non-exposed surface, from which the pressure-sensitive adhesive tape had been detached after the plasma irradiation, was measured using the method of the above-described surface roughness measurement, and the etching rate was calculated therefrom. Measurements were performed at three measurement points for each coating, and an average value of the found values was calculated.

Atmospheric gas: $CF_4/O_2/Ar=15/30/20$ (cc/min)
High frequency power: RF 300W
Pressure: 5 Pa
Etching time: 8 hours

TABLE 1

|  | Aluminum source | $Al_2O_3$ [kg] | $Y_2O_3$ [kg] | Rotational speed of atomizer (rpm) | Firing temperature (° C.) |
|---|---|---|---|---|---|
| Ex. 1 | Alumina | 10 | 14 | 12500 | 1400 |
| Ex. 2 | Alumina | 10 | 14 | 12500 | 1500 |
| Ex. 3 | Alumina | 10 | 13.6 | 12500 | 1400 |
| Ex. 4 | Alumina | 10 | 13.6 | 12500 | 1500 |
| Ex. 5 | Alumina | 10 | 14.6 | 12500 | 1400 |
| Ex. 6 | Alumina | 10 | 14.6 | 12500 | 1500 |
| Ex. 7 | Alumina | 10 | 14 | 20000 | 1400 |
| Ex. 8 | Alumina | 10 | 14 | 25000 | 1400 |
| Ex. 9 | Aluminum oxyhydroxide | 10 | 14 | 12500 | 1300 |
| Ex. 10 | Aluminum oxyhydroxide | 10 | 14 | 12500 | 1200 |
| Ex. 11 | Aluminum hydroxide | 10 | 14 | 12500 | 1400 |
| Ex. 12 | Aluminum hydroxide | 10 | 14 | 12500 | 1300 |
| Com. Ex. 1 | — | — | — | 12500 | 1650 |
| Com. Ex. 2 | Alumina | 10 | 0 | 12500 | 1400 |
| Com. Ex. 3 | — | 0 | 14 | 12500 | 1400 |
| Ex. 13 | Alumina | 10 | 14 | 12500 | 1400 |
| Ex. 14 | Alumina | 10 | 14 | 12500 | 1400 |
| Com. Ex. 4 | Alumina | 10 | 12.6 | 12500 | 1600 |

TABLE 2

| | Relative intensity of X-ray diffraction peak | | | | | | | Pore first peak (μm) | Pore second peak (μm) | Pore volume V1 for 0.1 to 1 μm (mL/g) | Pore volume V2 for 5 to 50 μm (mL/g) |
|---|---|---|---|---|---|---|---|---|---|---|---|
| | $Y_3Al_5O_{12}$ (S1) | $YAlO_3$ (S2) | $Y_2O_3$ (S3) | $Al_2O_3$ (S4) | S2/S1 | S3/S1 | S4/S1 | | | | |
| Ex. 1 | 100 | 5 | 1.5 | 0 | 0.05 | 0.015 | 0 | 0.31 | 15.1 | 0.23 | 0.34 |
| Ex. 2 | 100 | 7 | 0.7 | 0 | 0.07 | 0.007 | 0 | 0.39 | 16.5 | 0.17 | 0.29 |
| Ex. 3 | 100 | 7 | 0 | 0 | 0.07 | 0 | 0 | 0.28 | 15.1 | 0.21 | 0.33 |
| Ex. 4 | 100 | 7 | 0 | 0 | 0.07 | 0 | 0 | 0.35 | 16.5 | 0.14 | 0.27 |
| Ex. 5 | 100 | 25 | 2.2 | 0 | 0.25 | 0.022 | 0 | 0.32 | 15.1 | 0.25 | 0.34 |
| Ex. 6 | 100 | 27 | 1.4 | 0 | 0.27 | 0.014 | 0 | 0.38 | 16.5 | 0.18 | 0.29 |
| Ex. 7 | 100 | 6 | 1.4 | 0 | 0.06 | 0.014 | 0 | 0.29 | 10.6 | 0.24 | 0.32 |
| Ex. 8 | 100 | 5 | 1.4 | 0 | 0.05 | 0.014 | 0 | 0.28 | 7.0 | 0.23 | 0.30 |
| Ex. 9 | 100 | 5 | 1.4 | 0 | 0.05 | 0.014 | 0 | 0.29 | 15.1 | 0.17 | 0.33 |
| Ex. 10 | 100 | 4 | 2 | 0 | 0.04 | 0.02 | 0 | 0.25 | 15.1 | 0.26 | 0.36 |
| Ex. 11 | 100 | 7 | 1.3 | 0 | 0.07 | 0.013 | 0 | 0.34 | 13.9 | 0.18 | 0.30 |
| Ex. 12 | 100 | 3 | 1.7 | 0 | 0.03 | 0.017 | 0 | 0.28 | 15.1 | 0.24 | 0.28 |
| Com. Ex. 1 | 100 | 0 | 0 | 0 | 0 | 0 | 0 | 1.49 | 13.9 | 0.03 | 0.33 |
| Com. Ex. 2 | 0 | 0 | 0 | 100 | — | — | — | 0.38 | 13.9 | 0.19 | 0.38 |

TABLE 2-continued

| | | | | | | | | | | |
|---|---|---|---|---|---|---|---|---|---|---|
| Com. Ex. 3 | 0 | 0 | 100 | 0 | — | — | — | 0.32 | 15.1 | 0.20 | 0.32 |
| Ex. 13 | 100 | 5 | 1.5 | 0 | 0.05 | 0.015 | 0 | 0.31 | 15.1 | 0.23 | 0.34 |

| | | Crystallite size | BET specific surface area | Granule size | Coating method/Sintered material | Surface roughness of coating (μm) | | Etching rate |
|---|---|---|---|---|---|---|---|---|
| | V1/V2 | (nm) | (m2/g) | (μm) | | Ra | Rz | (nm/min) |
| Ex. 1 | 0.68 | 86 | 2.5 | 44 | Thermal spraying | 4.5 | 48 | 1.5 |
| Ex. 2 | 0.59 | 102 | 2.0 | 43 | Thermal spraying | 4.7 | 45 | 1.7 |
| Ex. 3 | 0.64 | 84 | 2.7 | 43 | Thermal spraying | 4.2 | 47 | 1.6 |
| Ex. 4 | 0.52 | 98 | 2.2 | 43 | Thermal spraying | 4.6 | 52 | 1.6 |
| Ex. 5 | 0.74 | 90 | 2.5 | 45 | Thermal spraying | 4.8 | 47 | 2.2 |
| Ex. 6 | 0.62 | 105 | 2.1 | 45 | Thermal spraying | 5.1 | 48 | 2.0 |
| Ex. 7 | 0.75 | 87 | 2.7 | 32 | Thermal spraying | 3.8 | 42 | 1.8 |
| Ex. 8 | 0.77 | 83 | 2.8 | 22 | Thermal spraying | 4.0 | 39 | 1.6 |
| Ex. 9 | 0.52 | 92 | 2.6 | 44 | Thermal spraying | 4.9 | 47 | 2.1 |
| Ex. 10 | 0.72 | 88 | 3.0 | 45 | Thermal spraying | 5.3 | 50 | 1.9 |
| Ex. 11 | 0.60 | 94 | 2.2 | 42 | Thermal spraying | 5.2 | 53 | 2.0 |
| Ex. 12 | 0.86 | 91 | 2.8 | 43 | Thermal spraying | 4.8 | 48 | 1.9 |
| Com. Ex. 1 | 0.09 | 112 | 0.5 | 42 | Thermal spraying | 8.3 | 88 | 3.5 |
| Com. Ex. 2 | 0.50 | 88 | 2.4 | 44 | Thermal spraying | 5.2 | 54 | 20.0 |
| Com. Ex. 3 | 0.63 | 95 | 2.1 | 42 | Thermal spraying | 4.8 | 49 | 6.0 |
| Ex. 13 | 0.68 | 86 | 2.5 | 44 | PVD | 0.02 | 0.1 | 1.1 |

INDUSTRIAL APPLICABILITY

A coating or a sintered material that is highly corrosion resistant against plasma etching can be easily formed by using the powder for coating or sintering of the present invention.

The invention claimed is:

1. A powder for coating or sintering, exhibiting a peak assigned to cubic $Y_3Al_5O_{12}$ and a peak assigned to orthorhombic $YAlO_3$ in X-ray diffractometry,
   wherein an intensity ratio of a peak assigned to a (112) plane of the orthorhombic $YAlO_3$ to a peak assigned to a (420) plane of the cubic $Y_3Al_5O_{12}$ is at least 0.01 and less than 1,
   the powder exhibits a peak within a pore size range from 0.1 to 1 μm and a peak within a pore size range from 5 to 50 μm in a pore volume distribution relative to pore sizes as measured by mercury intrusion porosimetry,
   a volume of pores with a pore size of from 0.1 to 1 μm is at least 0.16 mL/g and 1.0 mL/g or less, and
   a ratio of a pore volume V1 to a pore volume V2 (V1/V2) is 0.3 to 1.0 where V1 is the volume of the pores with the pore size of from 0.1 to 1 μm and V2 is a volume of the pores with the pore size of from 5 to 50 μm.

2. The powder for coating or sintering according to claim 1, further exhibiting a peak assigned to cubic $Y_2O_3$ in the X-ray diffractometry, wherein an intensity ratio of a peak assigned to a (222) plane of the cubic $Y_2O_3$ to the peak assigned to the (420) plane of the cubic $Y_3Al_5O_{12}$ is at least 0.001 and less than 0.1.

3. The powder for coating or sintering according to claim 1, wherein an intensity ratio of a peak assigned to a (104) plane of trigonal $Al_2O_3$ to the peak assigned to the (420) plane of the cubic $Y_3Al_5O_{12}$ is less than 0.1.

4. The powder for coating or sintering according to claim 1, wherein the powder has a crystallite size of at least 50 nm as determined from a full width at half maximum of the peak assigned to the (420) plane of $Y_3Al_5O_{12}$ in the X-ray diffractometry.

5. The powder for coating or sintering according to claim 1, wherein the volume of pores with a pore size of from 5 to 50 μm is at least 0.1 mL/g.

6. The powder for coating or sintering according to claim 5, wherein the volume of pores with the pore size of from 5 to 50 μm is at least 0.1 mL/g and at most 0.5 mL/g.

7. The powder for coating or sintering according to claim 1, wherein the powder has a BET specific surface area of 1 to 5 m²/g.

8. The powder for coating or sintering according to claim 1, wherein the powder is granular and has an average particle size of at least 15 μm.

9. The powder for coating or sintering according to claim 1, wherein, in X-ray diffractometry using CuKα radiation in a scan range of 2θ=20° to 60°, a peak assigned to the cubic $Y_3Al_5O_{12}$ is a peak that has the highest peak intensity.

10. The powder for coating or sintering according to claim 1, wherein a ratio of an intensity S4 of a peak assigned to a (104) plane of trigonal $Al_2O_3$ to the intensity S1 of the peak assigned to the (420) plane of the cubic $Y_3Al_5O_{12}$, S4/S1, is at most 0.01.

11. The powder for coating or sintering according to claim 1, wherein the ratio (V1/V2) is 0.4 to 1.0.

12. The powder for coating or sintering according to claim 1, wherein the ratio (V1/V2) is 0.5 to 1.0.

13. A method for producing a coating, comprising a step of thermal spraying the powder for coating or sintering according to claim 1.

14. A method for producing a sintered material, comprising sintering the powder for coating or sintering according to claim 1.

15. A coating made from the powder for coating or sintering according to claim 1, formed by thermal spraying or PVD.

16. A sintered material made from the powder for coating or sintering according to claim 1.

17. A method for producing a coating, comprising a step of forming the coating by PVD using the powder for coating or sintering according to claim 1.

\* \* \* \* \*